US007833818B2

(12) United States Patent
Shih

(10) Patent No.: US 7,833,818 B2
(45) Date of Patent: Nov. 16, 2010

(54) INTEGRATED STRUCTURE OF MEMS DEVICE AND CMOS IMAGE SENSOR DEVICE AND FABRICATING METHOD THEREOF

(75) Inventor: Hui-Shen Shih, Chang-Hua Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 106 days.

(21) Appl. No.: 12/334,514

(22) Filed: Dec. 14, 2008

(65) Prior Publication Data

US 2010/0148283 A1 Jun. 17, 2010

(51) Int. Cl.
*H01L 21/00* (2006.01)
*H01L 21/4763* (2006.01)
(52) U.S. Cl. .......................................... 438/59; 438/618
(58) Field of Classification Search .................... 438/59, 438/618; 257/E21.536, E31.114
See application file for complete search history.

(56) References Cited

U.S. PATENT DOCUMENTS

2010/0090298 A1* 4/2010 Shih et al. .................... 257/419
2010/0151615 A1* 6/2010 Shiau et al. ..................... 438/65

* cited by examiner

*Primary Examiner*—William M. Brewster
(74) *Attorney, Agent, or Firm*—Winston Hsu; Scott Margo

(57) ABSTRACT

An integrated structure of MEMS device and CIS device and a fabricating method thereof includes providing a substrate having a CIS region and a MEMS region defined therein with a plurality of CIS devices positioned in the CIS region; performing a multilevel interconnect process to form a multilevel interconnect structure in the CIS region and the MEMS region and a micro-machined mesh metal in the MEMS region on a front side of the substrate; performing a first etching process to form a chamber in MEMS region in the front side of the substrate; forming a first mask pattern and a second mask pattern respectively in the CIS region and the MEMS region on a back side of the substrate; and performing a second etching process to form a plurality of vent holes connecting to the chamber on the back side of the substrate through the second mask pattern.

14 Claims, 15 Drawing Sheets

INTEGRATED STRUCTURE OF MEMS DEVICE AND CMOS IMAGE SENSOR DEVICE AND FABRICATING METHOD THEREOF

BACKGROUND OF THE INVENTION

1. Field of the Invention

The invention relates to an integrated structure of a microelectromechanical system (MEMS) device and a complementary metal-oxide semiconductor (CMOS) image sensor (CIS) device and a fabricating method thereof, and more particularly, to an integrated structure of MEMS microphone and CIS device and a fabricating method thereof.

2. Description of the Prior Art

MEMS devices are tiny 3D-structures, such as circuits, micro-sensors, and micro-actuators, formed on wafers by microminiaturization technology. Such devices are operated based on electromagnetic, electrostructive, thermoelectric, or piezoresistive effect, exemplarily. Conventionally MEMS devices are formed on insulators or other substrates by microelectronic techniques such as photolithography, vapor deposition, and etching. Nevertheless, it is a trend to fabricate MEMS devices by processes that have been applied in fabrication of conventional analog and digital complementary metal oxide semiconductor (CMOS) circuits.

Please refer to FIG. 1, which is a cross-sectional view of a conventional MEMS microphone. As shown in FIG. 1, a MEMS microphone 100 includes a silicon substrate 102 having a plurality of dielectric layers 104a, 104b, 104c, 104d, by which a plurality of metal layers 106a, 106b, 106c are respectively sandwiched therebetween, stacked and formed thereon. A portion of the metal layer 106a is patterned to form a micro-machined mesh metal 110; and other metal layers 106b, 106c are patterned to form openings above the micro-machined mesh metal 110 for exposing the micro-machined mesh metal 110.

The micro-machined mesh metal 110 of MEMS microphone 100 functions as a movable plate of a variable capacitor; it can be vibrated by a soundwave or contrarily pushes air to create a soundwave. Therefore vent holes are needed to connect the chamber 112, in which the micro-machined mesh metal 110 of the MEMS microphone 100 is positioned, to the external environment. If the chamber 112 and the micro-machined mesh metal 110 formed a vacuum, the micro-machined mesh metal 110 is not able to be pushed by soundwaves or push air to create the soundwaves. In the prior art, said vent holes 132 are formed by bonding a front surface of the substrate 102 to a carrier wafer 120 through a adhesive material 122, and followed by defining and etching a back side of the substrate 102 though a patterned hard mask 130. Thus the vent holes are obtained as shown in FIG. 1.

Please refer to FIG. 2, which is a cross-sectional view of a conventional CIS. The CIS 200 includes a silicon substrate 202 having a plurality of photodiodes 210 and a plurality of shallow trench isolations (STIs) 212 that provide electrical isolation between each photodiodes 210 formed therein. The CIS 200 also includes a plurality of dielectric layers 204a, 204b, 204c, by which a plurality of metal layers 206a, 206b are respectively sandwiched therebetween, formed on the silicon substrate 202. Said dielectric layers and the metal layers construct the multilevel interconnects as shown in FIG. 2.

Please refer to FIG. 2 again. The CIS 200 also includes a passivation layer 208 which protects above-mentioned elements from water, and a color filter array (CFA) 220 respectively corresponding to the photodiodes 210 formed on the front side of the silicon substrate 202. Furthermore, a planarization layer 222 and microlens 230 are formed on the CFA 220, and another protection layer 232 is formed on the microlens 230 to render protection to the microlens 230.

As mentioned above, it is a trend to fabricate MEMS devices by processes that have been applied in fabrication of conventional CMOS circuits. It is also a trend to integrate MEMS device and other devices in a wafer. However, when integrating the MEMS microphone and the CIS device, a problem emerges: The CFA of the CIS device is formed on the front side of the silicon substrate while fabrication of the vent holes of the MEMS microphone is performed on the back side of the silicon substrate. Therefore the CFA and the microlens on the front side of the silicon substrate are unavoidably damaged during fabricating the vent holes. Such problem makes the integration of MEMS microphone and CIS device not allowed.

SUMMARY OF THE INVENTION

Therefore the present invention provides a competitive integrated structure of MEMS device and CIS device and a fabricating method thereof.

According to the claimed invention, a method for fabricating an integrated structure of MEMS device and CMOS image sensor (CIS) device is provided. The method comprises steps of providing a substrate having a CIS region and a MEMS region defined therein, the CIS region comprising a plurality of CIS devices; performing a multilevel interconnect process to form a multilevel interconnect structure in the CIS region and the MEMS region, and simultaneously to form a micro-machined mesh metal in the MEMS region in a front side of the substrate; performing a first etching process to form a chamber and release the micro-machined mesh metal in the MEMS region; forming a first mask pattern and a second mask pattern respectively in the CIS region and the MEMS region on a back side of the substrate, the first mask pattern respectively corresponding to the CIS devices and the second mask pattern used to define a plurality of vent holes in the MEMS region; and performing a second etching process to etch the back side of the substrate through the second mask pattern to form the vent holes connecting to the chamber.

According to the claimed invention, an integrated structure of MEMS device and CIS device is provided. The integrated structure comprises a substrate having a CIS region and a MEMS region defined therein, the CIS region further comprising a plurality of CIS devices; a multilevel interconnect structure formed in the CIS region and the MEMS region on a front side of the substrate; a chamber formed in the MEMS region on the front side of the substrate; a micro-machined mesh metal formed in the chamber; a color filter array (CFA) and a microlens array formed in the CIS region on a back side of the substrate; and a plurality of vent holes connecting to the chamber formed in the MEMS region in the back side of the substrate.

According to the integrated structure of MEMS device and CIS device and fabricating method provided by the present invention, the CFA and the microlens array are both formed on the back side of the substrate; therefore the CFA and the microlens array are prevented from being damaged during forming the vent holes on the back side of the substrate. More noteworthy, since the material used to form the mask pattern that defines the vent holes is a single photoresist layer or a multi-layer photoresist stack which is similar with the photoresist materials used to construct the CFA or microlens array, and since definition of the vent holes is completed simultaneously with forming the CFA or microlens array, the integration of the MEMS device and the CIS device is achieved without increasing process complexity and cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
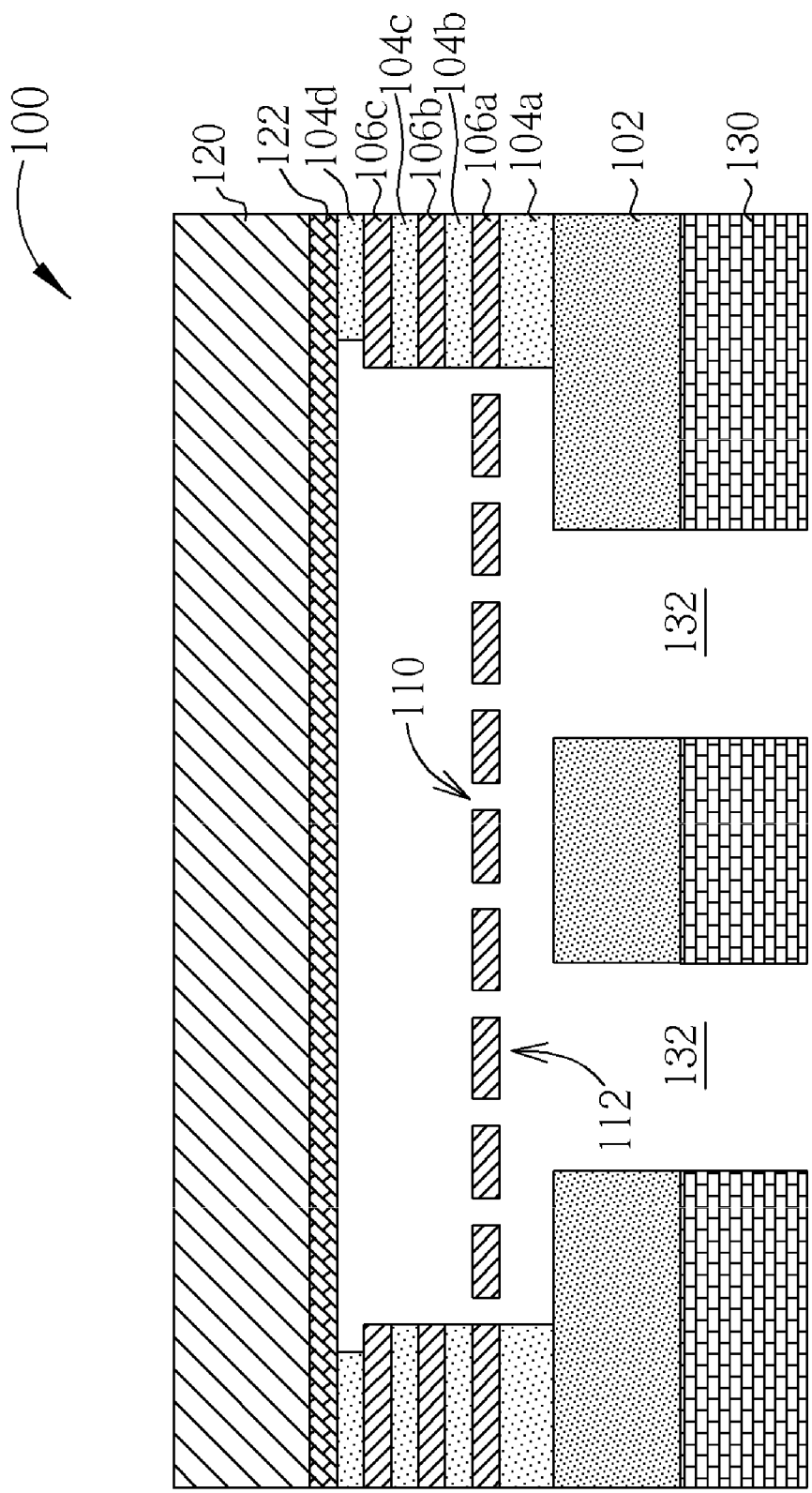
FIG. 1 is a cross-sectional view of a conventional MEMS microphone.
Figure 2:
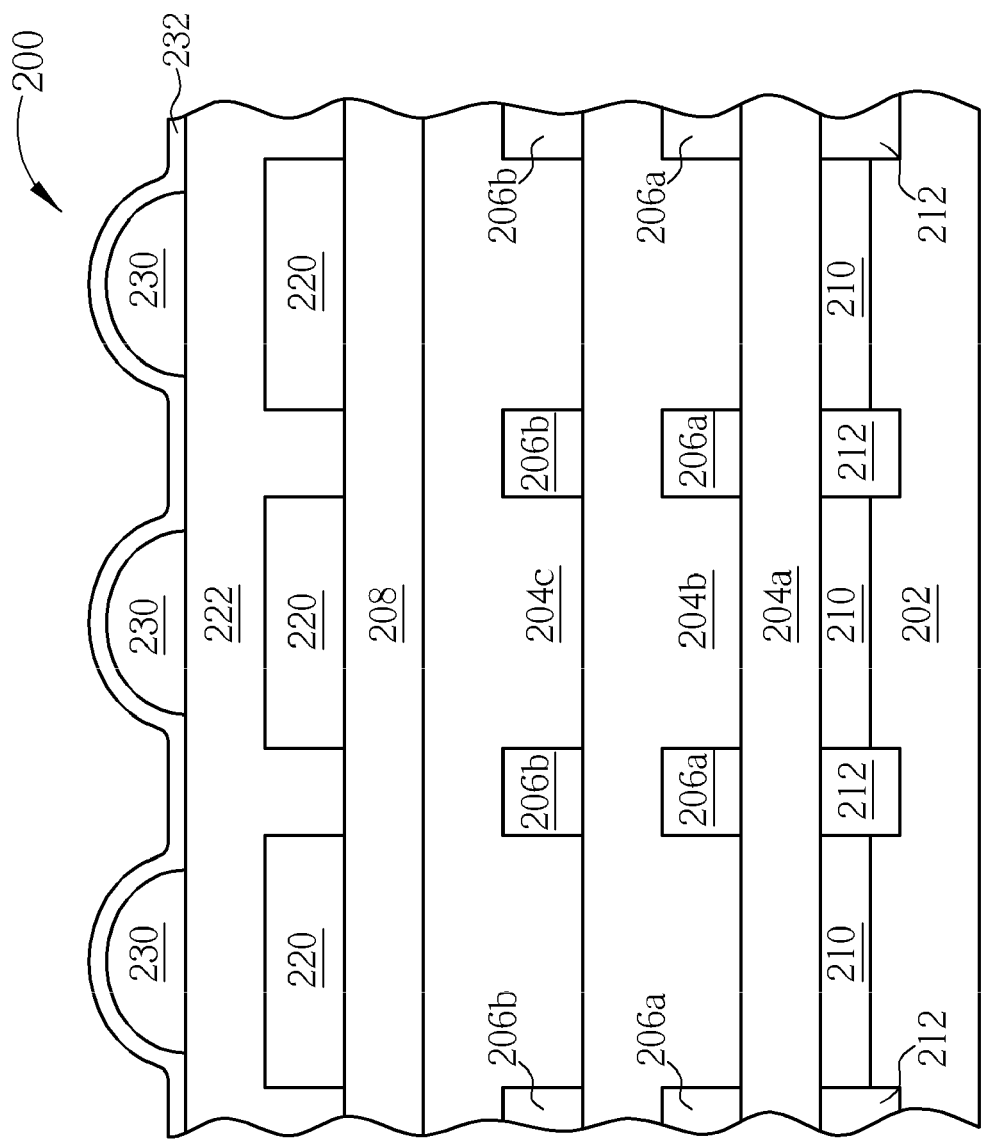
FIG. 2 is a cross-sectional view of a conventional CIS device.
Figure 3:
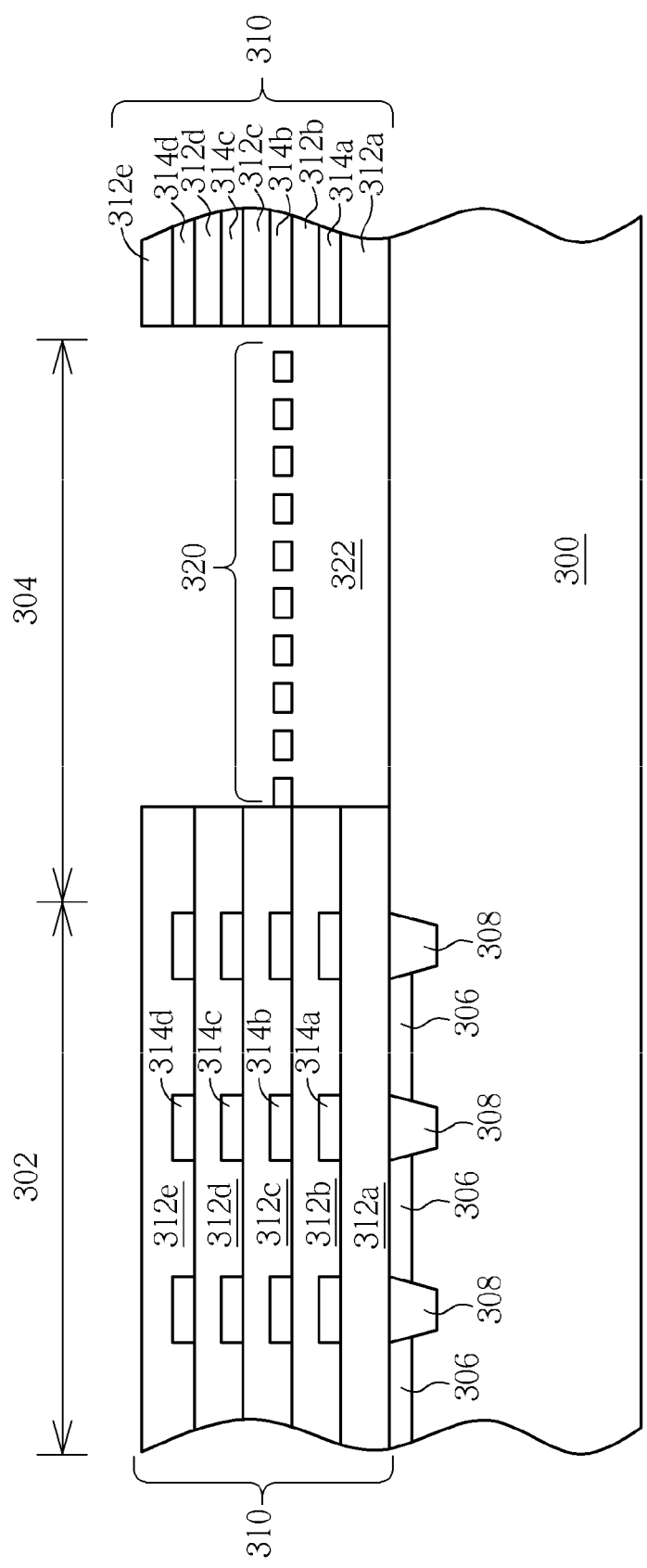
FIGS. 3-8 are schematic drawings illustrating the method for fabricating an integrated structure of MEMS device and CIS device provided by a first preferred embodiment of the present invention.

Please refer to FIGS. 3-8, which are schematic drawings illustrating the method for fabricating an integrated structure of MEMS device and CIS device provided by a first preferred embodiment of the present invention. As shown in FIG. 3, a silicon substrate 300 having a CIS region 302 and a MEMS region 304 defined therein is provided. The CIS region 302 further comprises a plurality of CIS devices such as photodiodes 306 shown in FIG. 3. Each photodiode 306 is electrically connected to a corresponding reset transistor and MOS transistors of current source follower and row selector (not shown). A plurality of shallow trench isolations (STIs) 308 is provided to electrically isolate adjacent photodiodes 306 and the MOS transistors.

Figure 4:
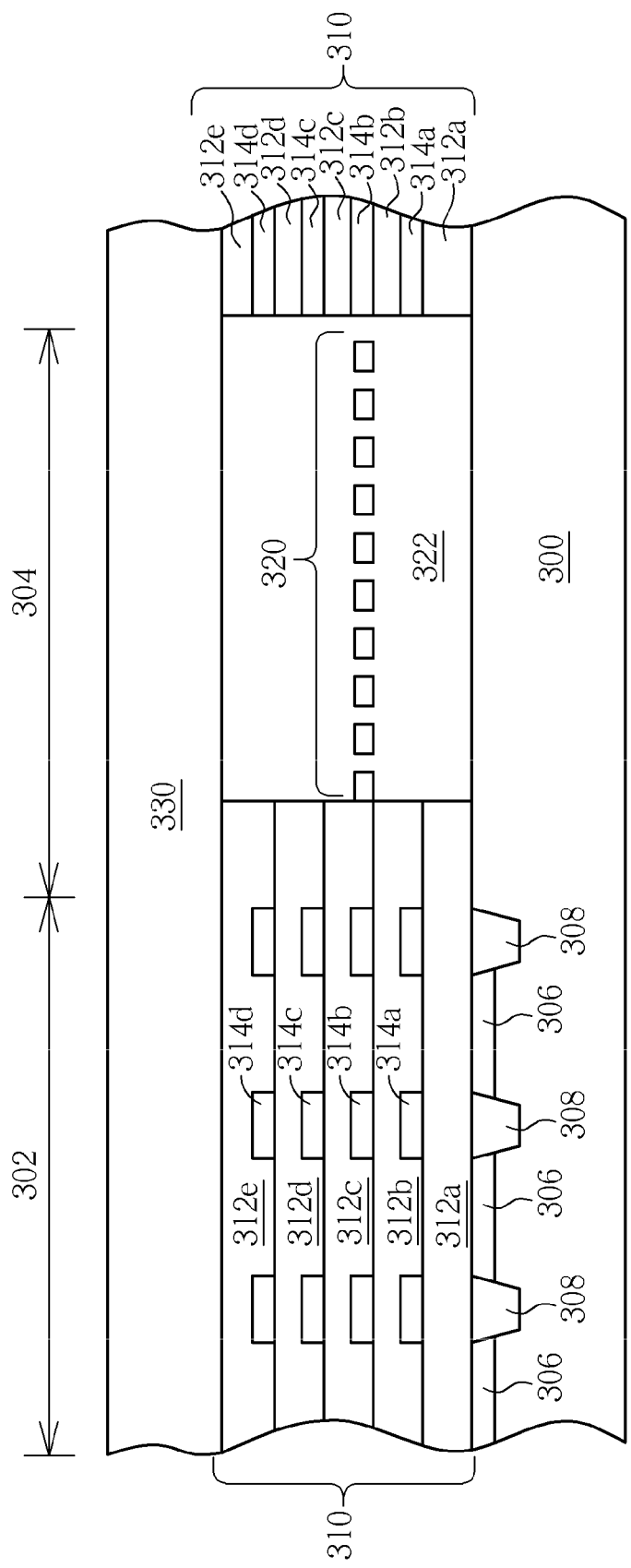

Please refer to FIG. 3 again. Next, a multilevel interconnect process is performed to form a multilevel interconnect structure 310 in the CIS region 302 and the MEMS region 304 on a front side of the substrate 300. The multilevel interconnect structure 310 comprises a plurality of inter metal dielectric (IMD) layers 312a, 312b, 312c, 312d, 312e exemplarily comprising silicon oxide (SiO) and formed by conventional chemical vapor deposition (CVD). Between each of the IMD layers 312a, 312b, 312c, 312d, 312e, a plurality of metal layers 314a, 314b, 314c, 314d is formed and sandwiched by the IMD layer 312a, 312b, 312c, 312d, 312e, respectively. Furthermore, during the multilevel interconnect process, the metal layer 314b in the MEMS region 304 is simultaneously patterned to form a micro-machined mesh metal 320 while no metal layers are left above or under the micro-machined mesh metal 320 as shown in FIG. 4. Those skilled in the art would easily realize that the micro-machined mesh metal 320 is not limited to be one single layer, it is not limited to be formed simultaneously with the metal layer 314b either. The micro-machined mesh metal 320 can be formed with the metal layer 314a or 314c.

Please still refer to FIG. 3. After the multilevel interconnect process, a patterned photoresist (not shown) is formed to cover the CIS region 302 and a portion of the MEMS region 304. Then a first etching process, preferably an anisotropic etching process such as a deep reactive-ion etching (DRIE), a reactive-ion etching (RIE), or an inductively coupled plasma active-ion etching (ICP RIE) is performed to etch the dielectric layers 312a, 312b, 312c, 312d, 312e in the MEMS region 304 through the patterned photoresist, thus a chamber 322 in which the micro-machined mesh metal 320 is released is formed in the MEMS region 304 as shown in FIG. 3. Then the patterned photoresist is removed.

Please refer to FIG. 4. Next, a step of bonding the front side of the substrate 300 to a carrier wafer 330 is performed. And before said step, a protection photoresist (not shown) is selectively formed on the substrate 300 to protect the micro-machined mesh metal 320 released in the chamber 322. Furthermore, a wafer thinning process is performed before or after bonding the substrate 300 to the carrier wafer 330 in order to decrease a thickness of the substrate 300, so that light is able to penetrate through the substrate 300 and reach the photodiodes 306.

Figure 5:
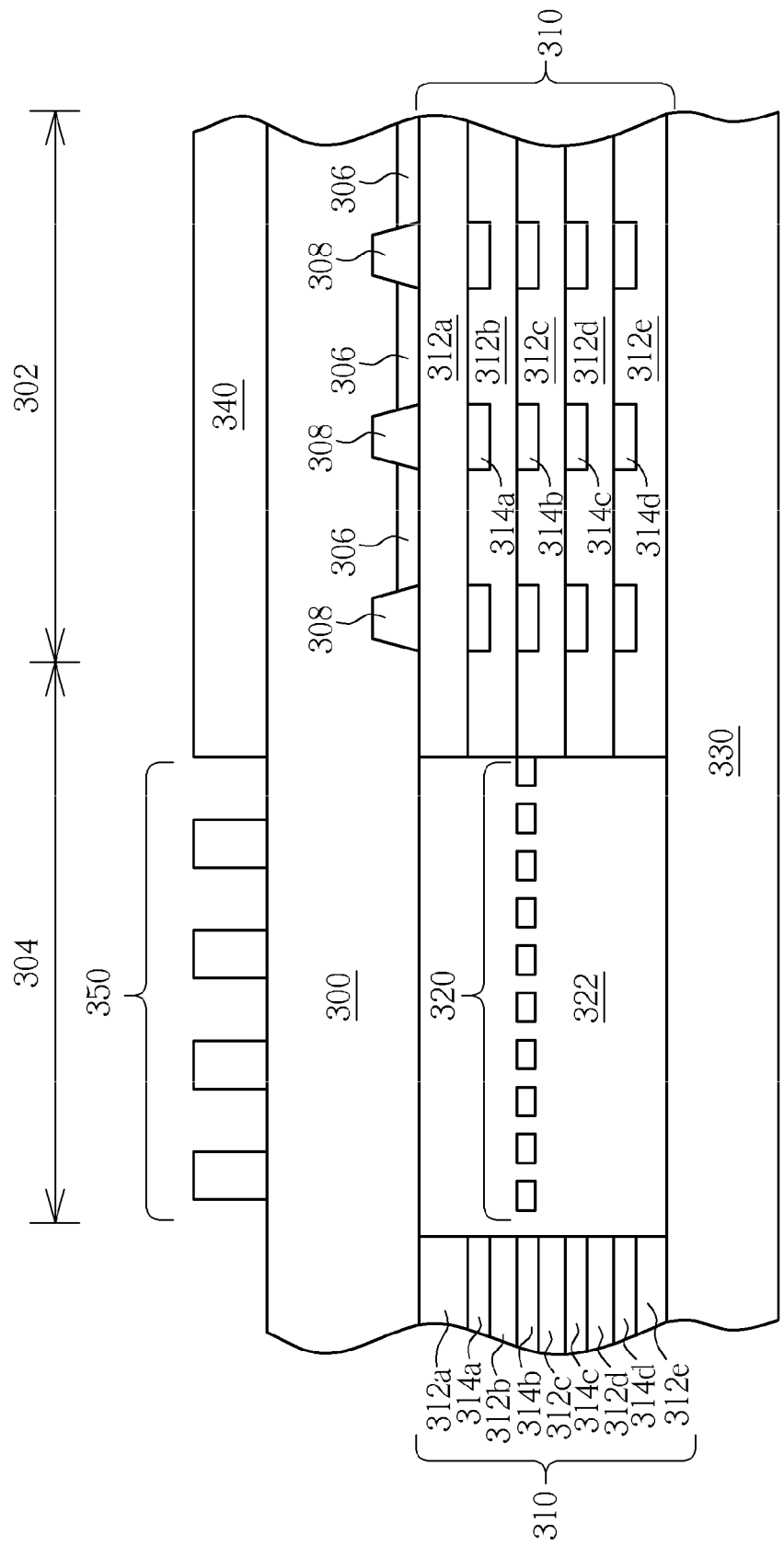

Please refer to FIG. 5. Next, a first mask pattern 340 and a second mask pattern 350 are respectively formed in the CIS region 302 and the MEMS region 304 on a back side of the substrate 300. The first mask pattern 340 is formed corresponding to the photodiodes 306 while the second mask pattern 350 is formed to define a plurality of vent holes (shown in FIG. 7) in the MEMS region 304. In the first preferred embodiment, the first mask pattern 340 and the second mask pattern 350 comprise a same material and are simultaneously patterned by a same photomask. The first mask pattern 340 and the second mask pattern 350 comprise inorganic photoresist material such as silicon oxide (SiO2), silicon oxynitride (SiON), or silicon nitride (SiN), etc.

Figure 6:
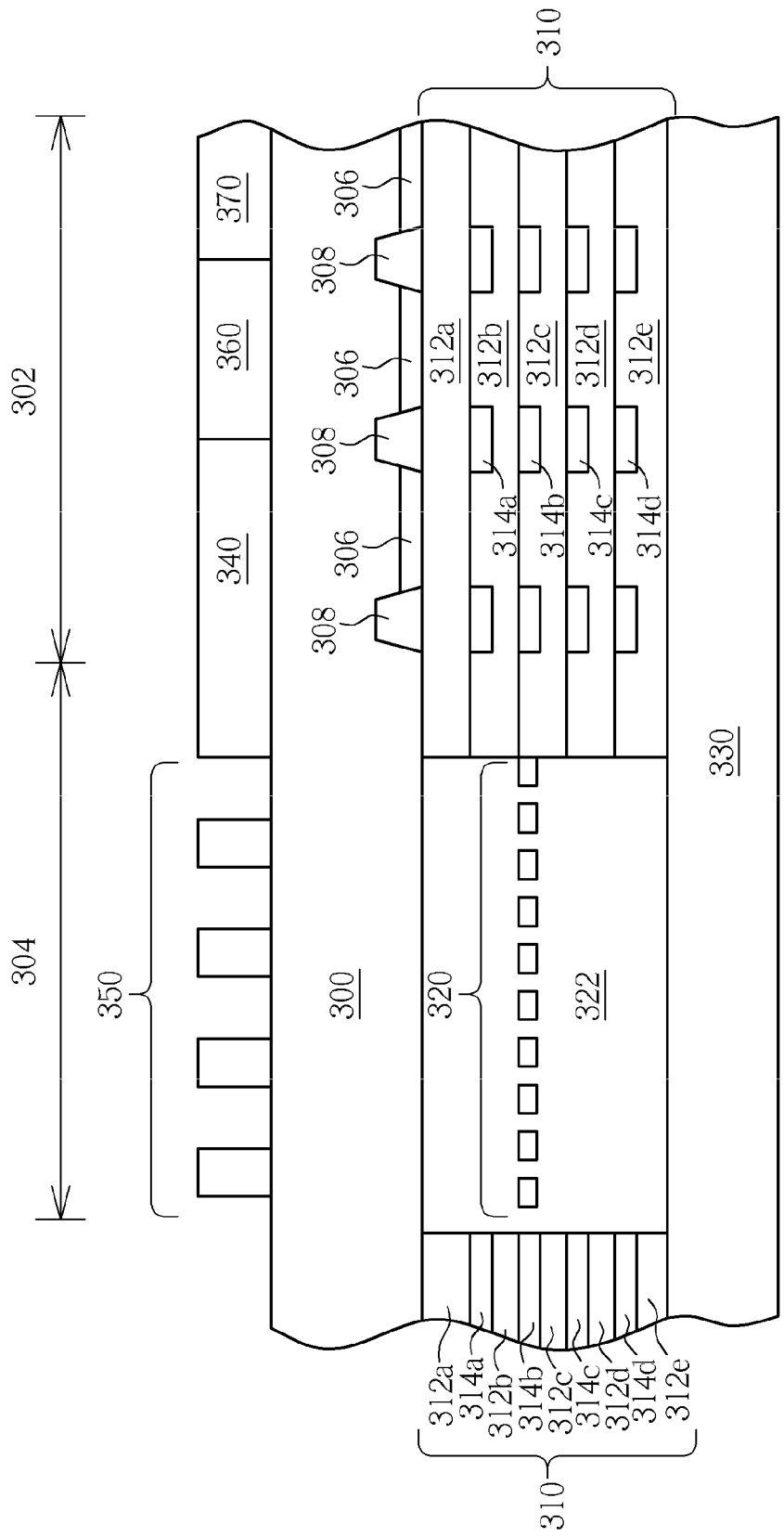

Please refer to FIG. 6. It is noteworthy that, the first mask pattern 340 and the second mask pattern 350 can comprise organic photoresist materials. Furthermore, a third mask pattern 360 and a fourth mask pattern 370 respectively corresponding to the photodiodes 306 are formed on the back side of the substrate 300 before forming the first mask pattern 340 and the second mask pattern 350. As shown in FIG. 6, the first mask pattern 340, the third mask pattern 360 and the fourth mask pattern 370 construct a color filter array (CFA). And the first mask pattern 340, the third mask pattern 360 and the fourth mask pattern 370 comprise different photoresist materials such as photoresist material having red, green, and blue (R/G/B). In other words, the CFA comprises three different photoresist materials and at least one of the photoresist materials is similar with a material used to form the second mask pattern 350. And the second mask pattern 350 is formed to define the vent holes simultaneously with forming the last color filter pattern of the CFA, which is the first mask pattern 340 in the first preferred embodiment with a same photomask.

Figure 7:
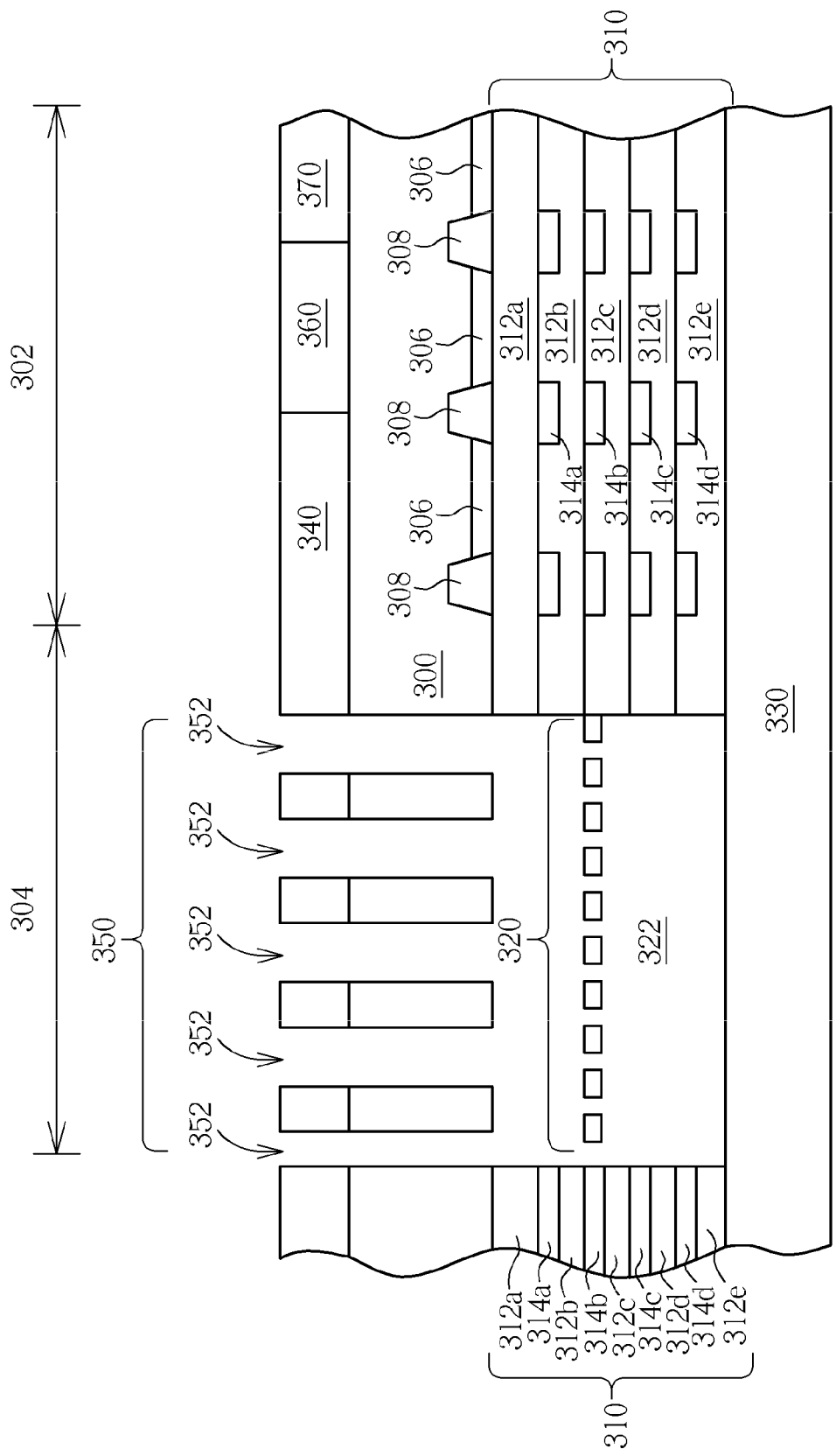

Please refer to FIG. 7. Then, a second etching process is performed with the mask patterns 340, 350, 360 and 370 serving as an etching mask. Said second etching process can be RIE, DRIE or ICP RIE. The second etching process is performed to form a plurality of vent holes 352 connecting to the chamber 322 in the MEMS region 304 through the back side of the substrate 300.

Figure 8:
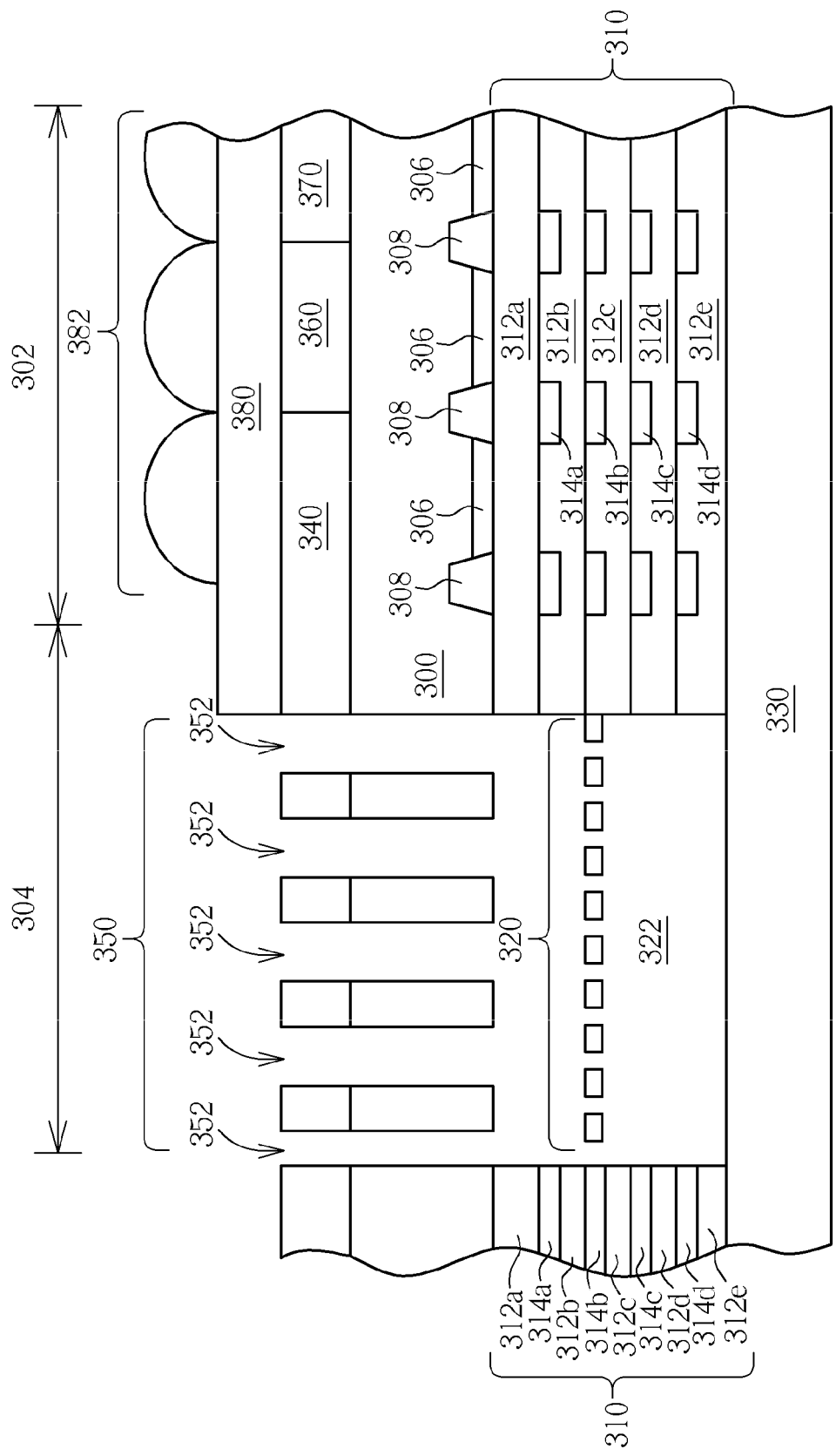

Please refer to FIG. 8. After the second etching process, a planarization layer 380 and a microlens array 382 are sequentially formed on the back side of the substrate 300, thus the integrated structure of MEMS device and CIS device is obtained. Additionally, a protection layer (not shown) is selectively formed on the microlens array 382 to render protection to the microlens array 382. According to a modification of the first preferred embodiment, the second mask pattern 350 is removed from the back side of the substrate 300 after the vent holes 352 are formed by the second etching process and followed by sequentially forming the planarization layer 380 and the microlens array 382 on the back side of the substrate 300.

According to the method for fabricating an integrated structure of MEMS device and CIS device provided by the first preferred embodiment and its modification, the CIS devices are fabricated by backside illumination (BSI) method, therefore the CFA 340/360/370 and the microlens array 382 are protected from being damaged during forming the vent holes 352 required by the MEMS microphone. And thus the integration of the CIS device and MEMS device are successfully allowed. More important, the second mask pattern 350 that defines the vent holes is formed simultaneously with forming the last color filter pattern of the CFA, which is the first mask pattern 340, by a same photomask in the first preferred embodiment. Therefore the integrated structure of MEMS device and CIS device is fabricated without increasing process complexity and cost.

Figure 9:
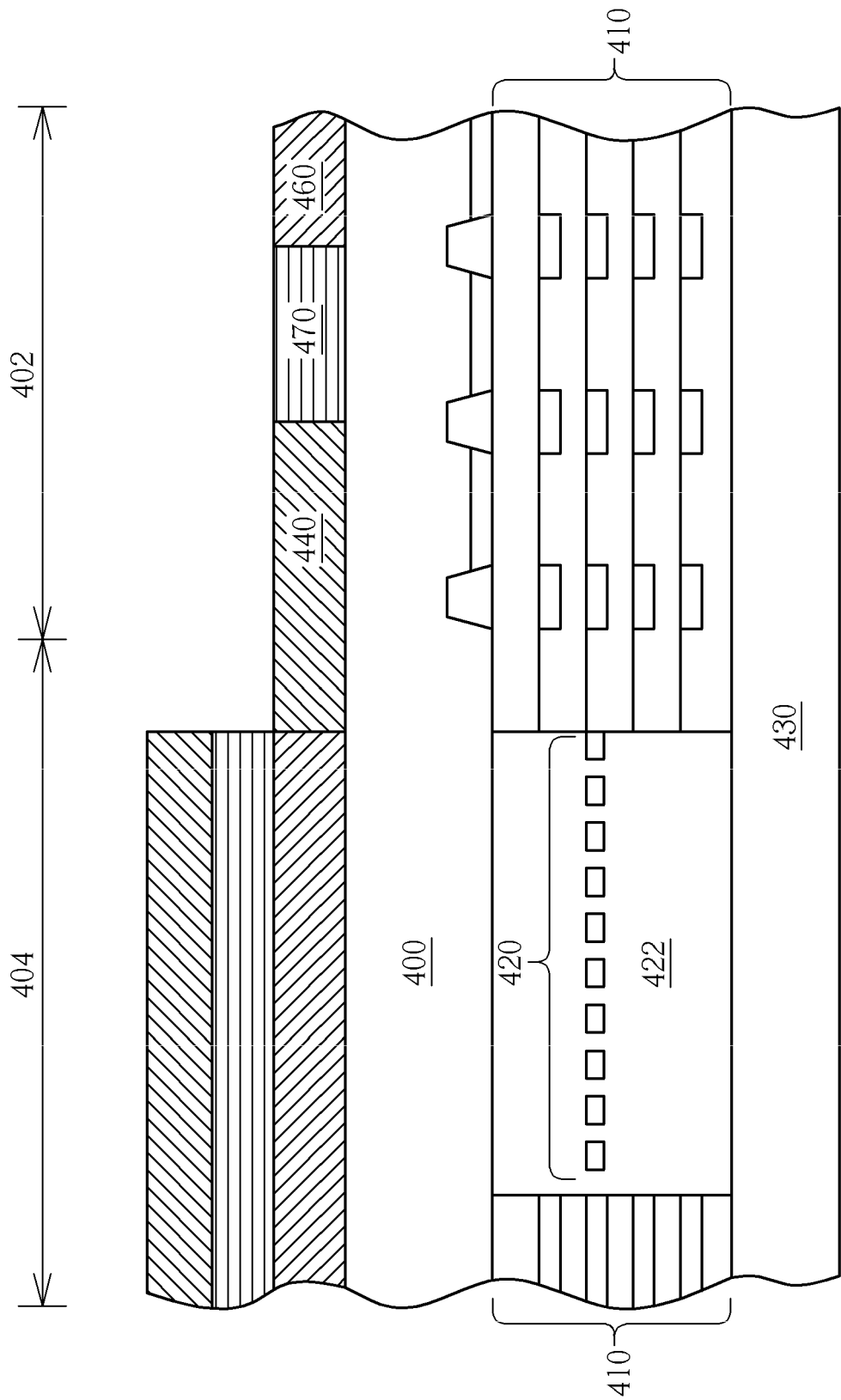
FIGS. 9-11 are schematic drawings illustrating the method for fabricating an integrated structure of MEMS device and CIS device provided by a second preferred embodiment of the present invention.
Figure 10:
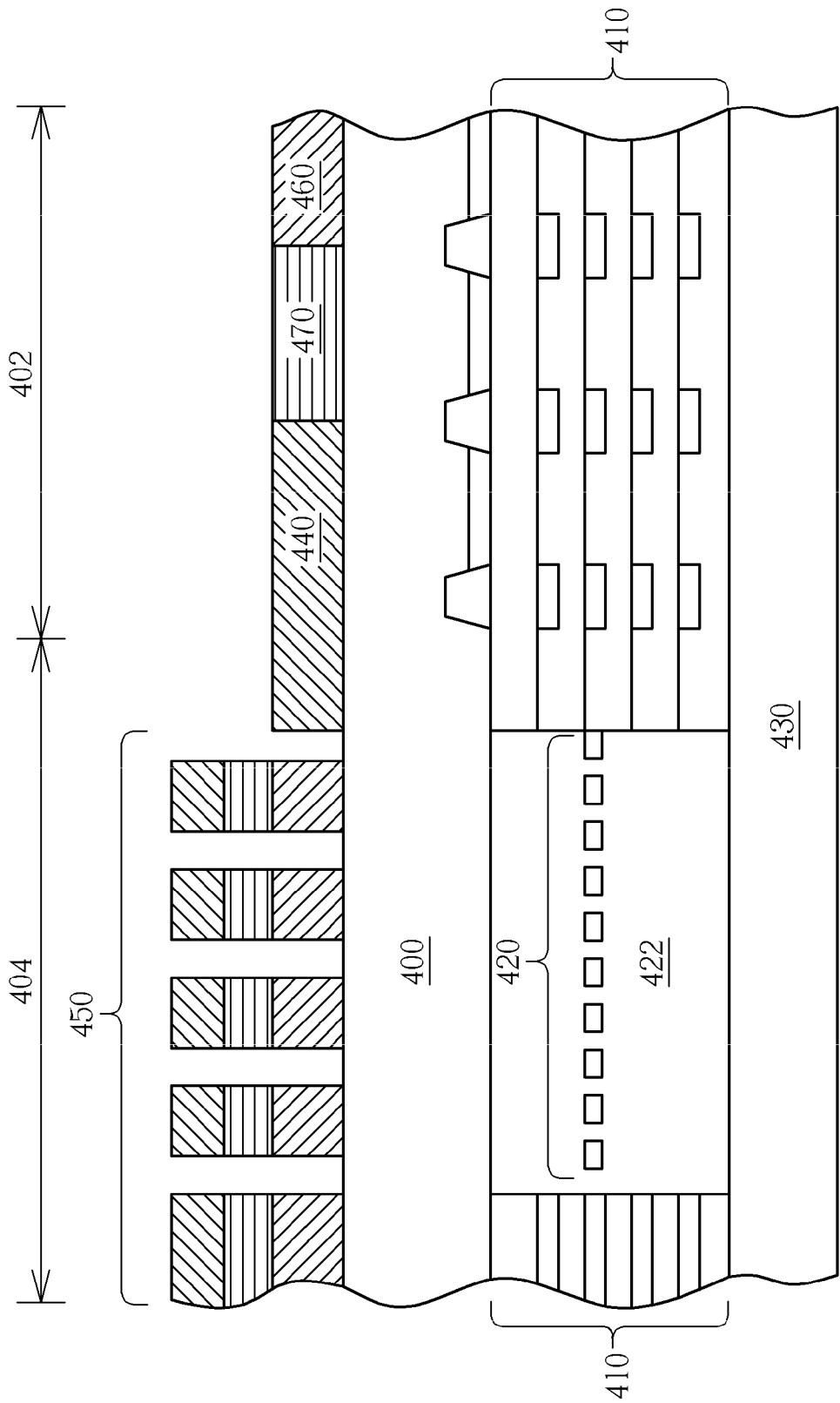
Figure 11:
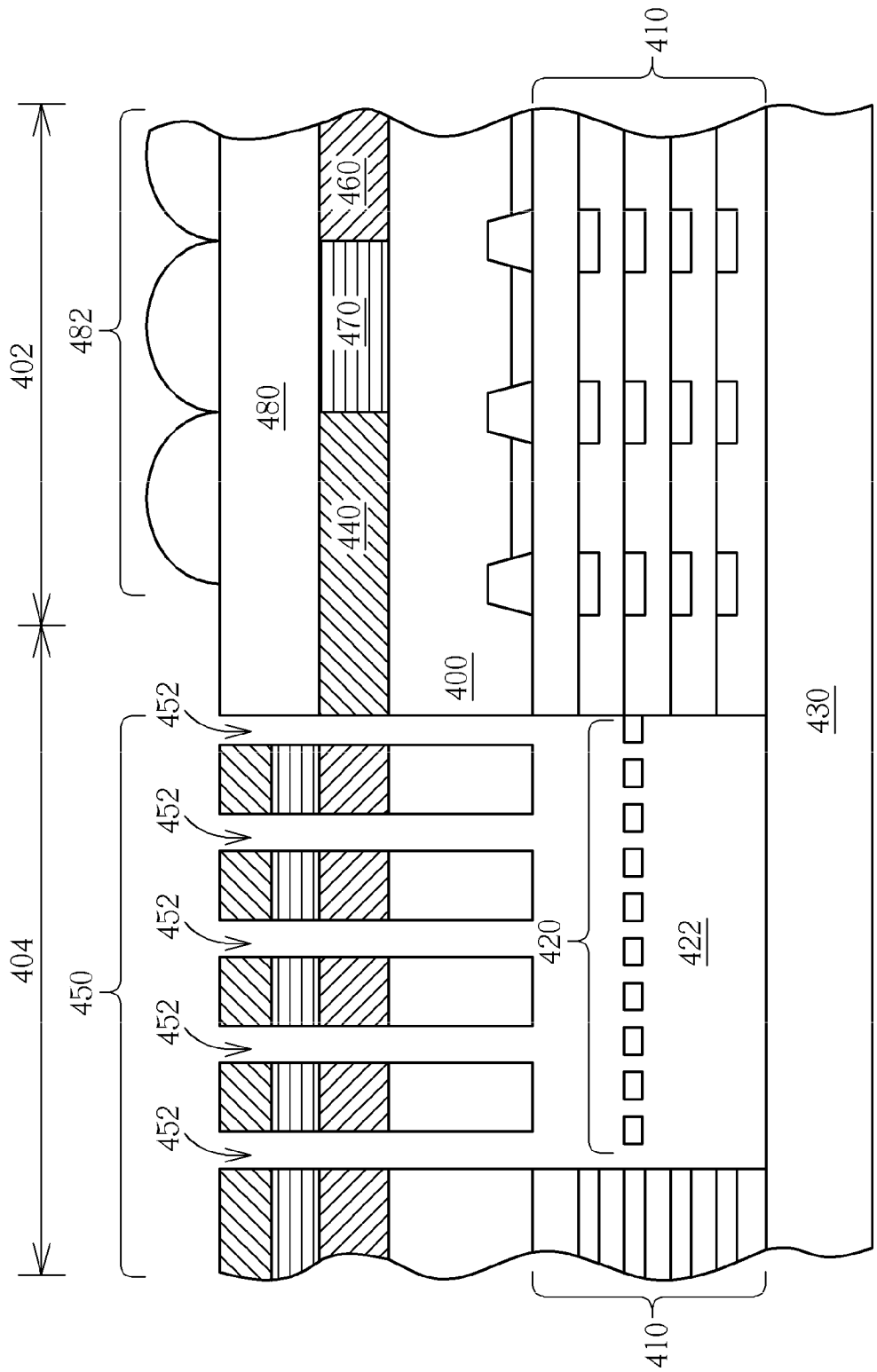

Please refer to FIGS. 9-11, which are schematic drawings illustrating the method for fabricating an integrated structure of MEMS device and CIS device provided by a second preferred embodiment of the present invention. Since steps of providing a substrate 400 having a CIS region 402 and a MEMS region 404 defined therein, and providing CIS devices and STIs formed in the CIS region 402, and steps of forming a multilevel interconnect structure 410 and relationships of IMD layers and metal layers therein, a chamber 422, and a micro-machined mesh metal 420 are similar with steps described in the first preferred embodiment, those skilled in the art would easily realize said steps according to the first preferred embodiment. Therefore those details are omitted in the interest of brevity herein. Please refer to FIG. 9. After forming the chamber 422 and releasing the micro-machined mesh metal 420, a step of bonding a front side of the substrate 400 to a carrier wafer 430 is performed. A protection photoresist layer is selectively formed on the substrate 400 before said step, and a wafer thinning process is performed as described in the first preferred embodiment, thus those details are also omitted herein.

Please refer to FIG. 9 again. Next, a first mask pattern 440 is formed in the CIS region 402 on the back side of the substrate 400. The first mask pattern 440 is formed corresponding to the CIS devices. It is noteworthy that before forming the first mask pattern 440, a third mask pattern 460 and a fourth mask pattern 470 are formed on the back side of the substrate 400; and the third mask pattern 460 and the fourth mask pattern 470 are respectively corresponding to the CIS devices. As shown in FIG. 11, the first mask pattern 440, the third mask pattern 460 and the fourth mask pattern 470 construct a CFA: the first mask pattern 440, the third mask pattern 460 and the fourth mask pattern 470 respectively comprise different photoresist material such as photoresist materials having red, green, or blue. Simultaneously with forming the photoresist materials of the first mask pattern 440, the third mask pattern 460 and the fourth mask pattern 470, a multi-level photoresist stack is formed in the MEMS region 404.

Please refer to FIG. 10. Next, the multi-level photoresist stack is patterned simultaneously with forming the first mask pattern 440 to form a second mask pattern 450 in the MEMS region 404. The second mask pattern 450 is formed to define a plurality of vent holes (shown in FIG. 11). In other words, the second mask pattern 450 is formed simultaneously with forming the last color filter pattern of the CFA, which is the first mask pattern 440, by a same photomask in the second preferred embodiment. However, it is not limited to form the second mask pattern 450 by another photolithographic process after forming the CFA depending on process or product requirements. According to the second preferred embodiment, the second mask pattern 450 comprises a multi-level photoresist stack having photoresist materials sequentially similar with those used to form the third mask pattern 460, the fourth mask pattern 470 and the first mask pattern 440.

Furthermore, according to a modification of the second preferred embodiment, the second mask pattern 450 comprises a multi-level photoresist stack having photoresist materials sequentially similar with those used to form the last two color filter patterns of the CFA, which are the fourth mask pattern 470 and the first mask pattern 440. It is noteworthy that the multi-level photoresist stack used to construct the second mask pattern 450 is not limited to two or three photoresist layers as described in the second preferred embodiment, those skilled in that art would easily realize that the multi-level photoresist stack can comprise more photoresist layers, even the photoresist layer that used to form the microlens depending on process or product requirements, and therefore drawings showing those modifications are omitted herein.

Please refer to FIG. 11. An etching process such as RIE, DRIE, or ICP RIE is performed after forming the first mask pattern 440 and the second mask pattern 450. Said etching process etches the back side of the substrate 400 through the second mask pattern 450, thus the plurality of vent holes 452 is obtained. It is observed that, after the etching process, surfaces of the MEMS region 404 and the CIS region 402 are not even due the existence of the second mask pattern 450, therefore a planarization layer 480 is selectively formed on the back side of the substrate 400. Then a microlens array 482 is formed on the planarization layer 480, thus the integrated structure of MEMS device and CIS device is obtained. Additionally, a protection layer (not shown) is selectively formed on the microlens array 482 to render protection to the microlens array 482.

In another modification of the second preferred embodiment, the second mask pattern 450, which is a multi-level photoresist stack, is removed from the back side of the substrate 400 after the etching process. Then the planarization layer 480 is selectively formed on the back side of the substrate 400 depending on process requirements, and followed by fabricating the microlens array.

According to the method for fabricating an integrated structure of MEMS device and CIS device provided by the second preferred embodiment and its modification, the CIS devices are fabricated by BSI method, therefore the CFA 440/460/470 and the microlens array 482 are protected from being damaged during forming the vent holes 452 required by the MEMS microphone. More important, the second mask pattern 450 that defines the vent holes 452 comprises a multi-level photoresist stack having at least two or three photoresist material layers, therefore the substrate 400 can be protected more completely and the resulted pattern of the vent holes 452 is more assured. Furthermore, since materials used to form the second mask pattern 450 that defines the vent holes 452 are similar with those used in the CFA, the integrated structure of MEMS device and CIS device is fabricated without increasing process complexity and cost.

Please refer to FIGS. 12-15, which are schematic drawings illustrating the method for fabricating an integrated structure of MEMS device and CIS device provided by a third preferred embodiment of the present invention. Since steps of providing a substrate 500 having a CIS region 502 and a MEMS region 504 defined therein, and providing CIS devices and STIs formed in the CIS region 502, and steps of forming a multilevel interconnect structure 510 and relationships of IMD layers and metal layers therein, a chamber 522, and a micro-machined mesh metal 520 are similar with steps described in the first preferred embodiment, those skilled in the art would easily realize said steps according to the first preferred embodiment, therefore those details are omitted in the interest of brevity herein.

Figure 12:
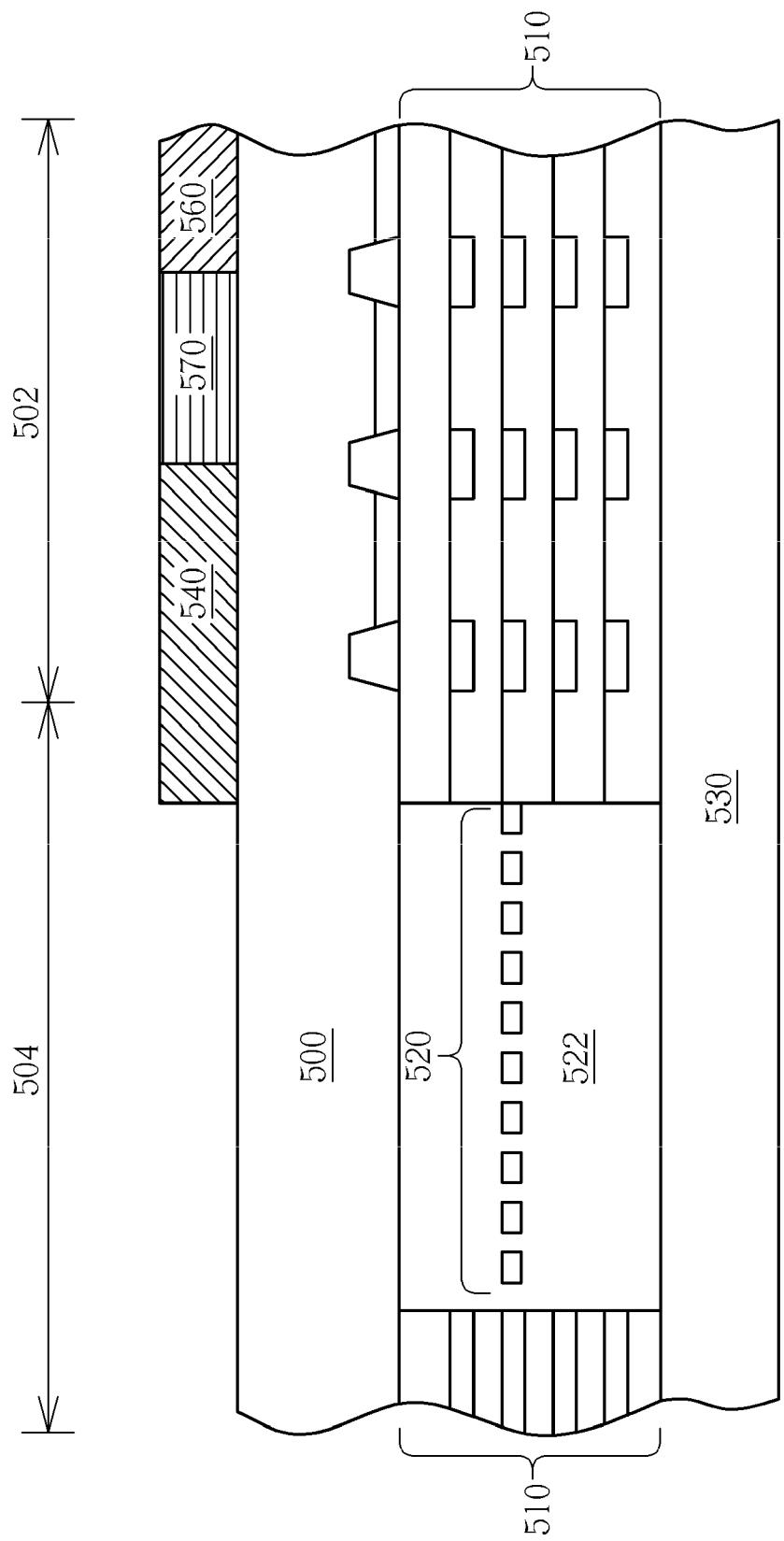
FIGS. 12-15 are schematic drawings illustrating the method for fabricating an integrated structure of MEMS device and CIS device provided by a third preferred embodiment of the present invention.

Please refer to FIG. 12, after forming the chamber 522 and releasing the micro-machined mesh metal 520, a step of bonding a front side of the substrate 500 to a carrier wafer 530 is performed. Furthermore, steps of selectively forming the protecting layer and performing the wafer thinning process are similar with those steps described in the first preferred embodiment, thus those details are also omitted herein.

Please refer to FIG. 12 again. Next, a CFA 540/570/560 respectively comprising red, green and blue photoresist materials is formed in the CIS region 502 on a back side of the substrate 500. The CFA 540/570/560 respectively corresponds to the CIS devices.

Figure 13:
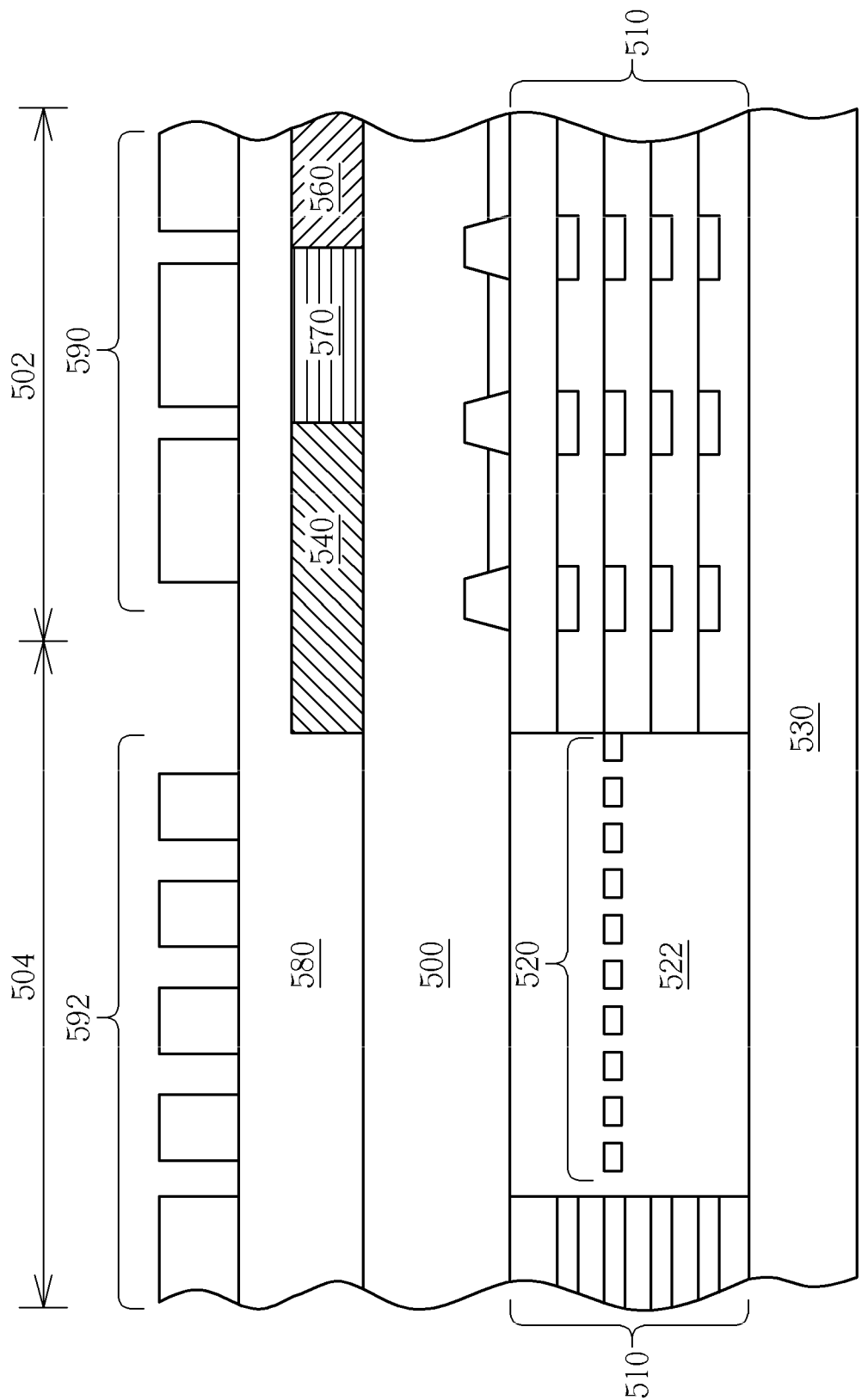

Please refer to FIG. 13. A planarization layer 580 is selectively formed on the back side of the substrate 500 after forming the CFA 540/570/560, and followed by forming a first mask pattern 590 and a second mask pattern 592 on the back side of the substrate 500. It is noteworthy that, the first mask pattern 590 is a microlens array pattern formed on the CFA 540/570/560 and corresponding to each of the CIS devices while the second mask pattern 592 is used to define a plurality of vent holes (shown in FIG. 14) in the MEMS region 504. The first mask pattern 590 and the second mask pattern 592 can comprise similar photoresist and are simultaneously formed by a same photomask.

Figure 14:
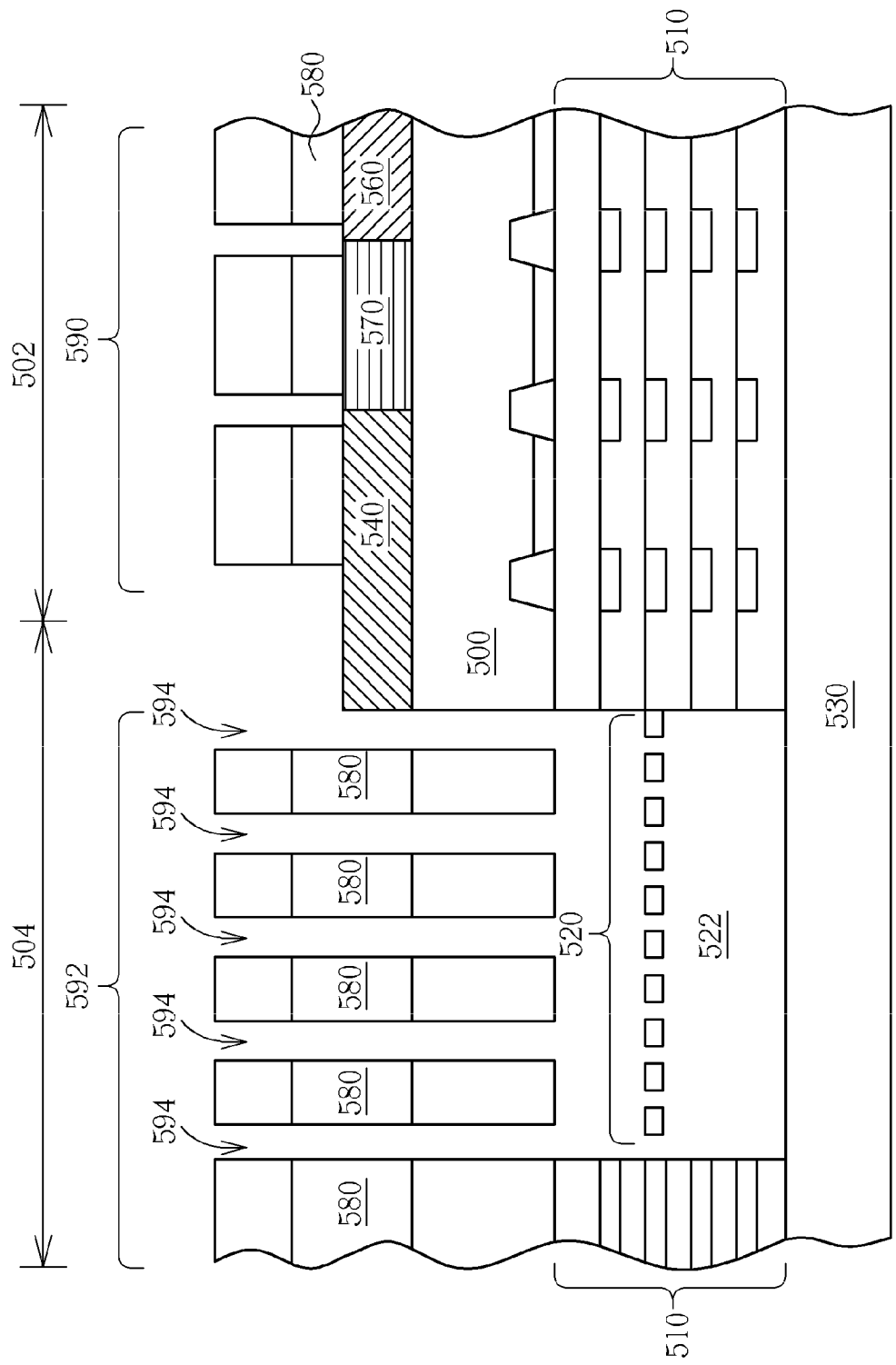

Please refer to FIG. 14. Then an etching process such as RIE, DRIE, or ICP RIE is performed to etch the back side of the substrate 500 through the second mask pattern 592, thus the plurality of vent holes 594 is obtained.

Figure 15:
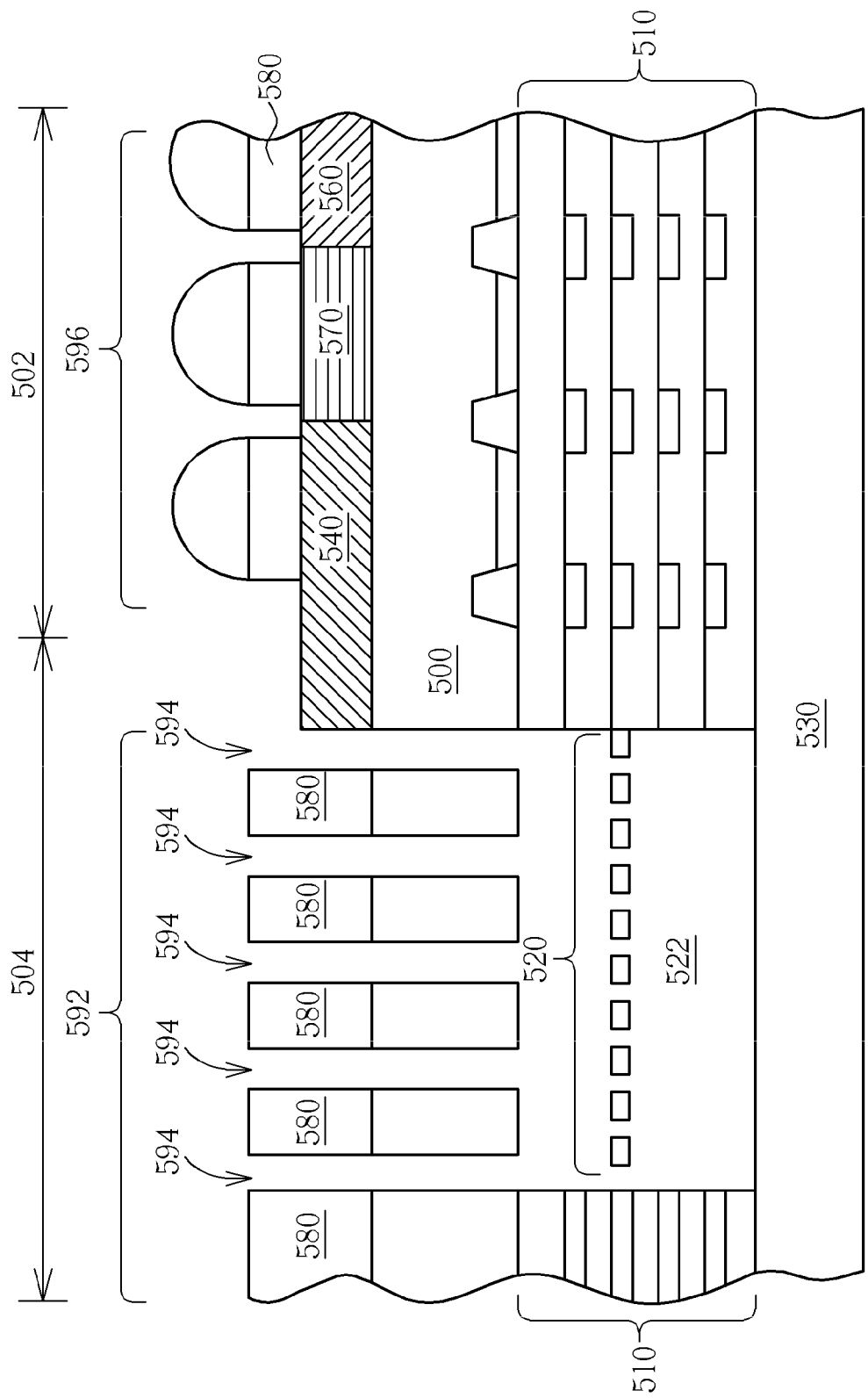

Please refer to FIG. 15. Next, the second mask pattern 592 is selectively removed. In the third preferred embodiment, the second mask pattern 592 is removed and followed by performing a reflow process. Thus the first mask pattern 590 is transformed and a microlens array 596 is obtained as shown in FIG. 15. Additionally a protection layer (not shown) is selectively formed on the microlens array 596 to render the protection to the microlens array 596.

According to the method for fabricating an integrated structure of MEMS device and CIS device provided by the third preferred embodiment, the CIS devices are fabricated by BSI method, therefore the CFA 540/570/560 and the microlens array 596 are protected from being damaged during forming the vent holes 594 required by the MEMS microphone. More important, the second mask pattern 592 is simultaneously formed with the formation of the microlens pattern, which is the first mask pattern 590, by a same photomask in the third preferred embodiment, therefore the integrated structure of MEMS device and CIS device is fabricated without increasing process complexity and cost.

Please refer to FIGS. 7, 11 and 15 again. According to the method for fabricating an integrated structure of MEMS device and CIS device provided by the first preferred embodiment, the second preferred embodiment and the third preferred embodiment, an integrated structure of MEMS device and CIS device is obtained. Said integrated structure comprises a substrate having a CIS region and a MEMS region defined therein, a plurality of CIS devices formed in the CIS region on a front side of the substrate, a multilevel interconnect structure and a chamber formed on the front side of the substrate, and a micro-machined mesh metal formed in the chamber. It is noteworthy that in the integrated structure of MEMS device and CIS device, a plurality of vent holes, which is used to connect the chamber to the external environment, formed in MEMS region and the CFA and the microlens array formed in the CIS region are all formed on the back side of the substrate.

The integrated structure of MEMS device and CIS device provided by the present invention further comprises a mask pattern, which is used to define the vent holes, formed on the back side of the substrate. The mask pattern comprises organic or inorganic photoresist material. As shown in FIG. 7, the CFA 340/370/360 comprises three different photoresist layers such as photoresist layer respectively having red, green, or blue, and at least one of the photoresist layer used to construct the CFA 340/370/360 is similar with the photoresist material used in the mask pattern 350. The mask pattern can further comprise a multi-level photoresist stack 450 as shown in FIG. 11. The multi-level photoresist stack 450 comprises two or three photoresist layer that are similar with those photoresist layers used to form the CFA 440/470/460. Said multi-level photoresist stack can even comprise photoresist material used to form the microlens.

Furthermore, according to the integrated structure of MEMS device and CIS device provided by the present invention, since the microlens array 596 is made of photoresist, the mask pattern 592 can be made of the same photoresist material as shown in FIG. 15.

As mentioned above, according to the integrated structure of MEMS device and CIS device and method thereof provided by the present invention, the CIS device are fabricated by BSI method, therefore the CFA array and the microlens array are protected from being damaged during forming the vent holes required by the MEMS microphone on the back side of the substrate. And thus the integration of the CIS device and MEMS device are successfully allowed. More noteworthy, since the material used to form the mask pattern that defines the vent holes is a single photoresist layer or a multi-layer photoresist stack which is similar with the photoresist materials used in the CFA or microlens array, and since definition of the vent holes is completed simultaneously with forming the CFA or microlens array, the integration of the MEMS device and the CIS device is achieved without increasing process complexity and cost.

Those skilled in the art will readily observe that numerous modifications and alterations of the device and method may be made while retaining the teachings of the invention.

What is claimed is:

1. A method for fabricating an integrated structure of MEMS device and CMOS image sensor (CIS) device comprising steps of:

providing a substrate having a CIS region and a MEMS region defined therein, the CIS region comprising a plurality of CIS devices;

performing a multilevel interconnect process to form a multilevel interconnect structure in the CIS region and the MEMS region on a front side of the substrate, and simultaneously to form a micro-machined mesh metal in the MEMS region on the front side of the substrate;

performing a first etching process to form a chamber and release the micro-machined mesh metal in the MEMS region;

forming a first mask pattern and a second mask pattern respectively in the CIS region and the MEMS region on a back side of the substrate, the first mask pattern respectively corresponding to the CIS devices and the second mask pattern used to define a plurality of vent holes in the MEMS region; and performing a second etching process to etch the back side of the substrate through the second mask pattern to form the vent holes connecting to the chamber.

2. The method of claim 1 further comprising a step of performing a wafer thinning process before forming the first mask pattern and the second mask pattern.

3. The method of claim 1 further comprising a step of bonding the front side of the substrate to a carrier wafer before forming the first mask pattern and the second mask pattern.

4. The method of claim 1, wherein first mask pattern and the second mask pattern comprise organic or inorganic photoresist material.

5. The method of claim 1, wherein the first mask pattern is a color filter (CF) pattern.

6. The method of claim 5, wherein the first mask pattern and the second mask pattern are formed by a same photomask.

7. The method of claim 5, wherein the second mask pattern comprises a multi-layer photoresist stack.

8. The method of claim 7, wherein the multi-layer photoresist stack comprises two photoresist layers.

9. The method of claim 7, wherein the multi-layer photoresist stack comprises three photoresist layers.

10. The method of claim 1 further comprising a step of sequentially forming a planarization layer and a microlens array after the second etching process.

11. The method of claim 10 further comprising a step of removing the second mask pattern after the second etching process and before the step of forming the planarization layer and the microlens array.

12. The method of claim 1 further comprising a step of forming a color filter array (CFA) in the CIS region on the back side of the substrate before forming the first mask pattern and the second mask pattern.

13. The method of claim 12, wherein the first mask pattern is a microlens array pattern formed on the CFA.

14. The method of claim 12 further comprising a step of forming a planarization layer on the CFA before forming the first mask pattern and the second mask pattern.

* * * * *